(12) United States Patent
Umetsu

(10) Patent No.: US 7,411,649 B2
(45) Date of Patent: Aug. 12, 2008

(54) METHOD FOR MANUFACTURING A CRYSTAL DEVICE

(75) Inventor: Kazushige Umetsu, Chino (JP)

(73) Assignee: Seiko Epson Corporation (JP)

( * ) Notice: Subject to any disclaimer, the term of this patent is extended or adjusted under 35 U.S.C. 154(b) by 430 days.

(21) Appl. No.: 11/299,335

(22) Filed: Dec. 9, 2005

(65) Prior Publication Data
US 2006/0126868 A1    Jun. 15, 2006

(30) Foreign Application Priority Data
Dec. 10, 2004    (JP)    ............... 2004-357508

(51) Int. Cl.
*G02F 1/13* (2006.01)
*H04R 25/00* (2006.01)

(52) U.S. Cl. ............... 349/187; 349/2; 381/173

(58) Field of Classification Search ............... 349/187, 349/2; 381/173
See application file for complete search history.

(56) References Cited

U.S. PATENT DOCUMENTS

| | | | |
|---|---|---|---|
| 5,393,371 A * | 2/1995 | Chang et al. | 216/24 |
| 5,481,633 A * | 1/1996 | Mayer | 385/49 |
| 5,587,822 A * | 12/1996 | Lee | 349/124 |
| 6,842,216 B1 * | 1/2005 | Ryu et al. | 349/187 |
| 7,304,005 B2 | 12/2007 | Yamazaki et al. | |
| 2003/0209710 A1 * | 11/2003 | Yamazaki et al. | 257/66 |
| 2007/0196937 A1 * | 8/2007 | Itoh et al. | 438/22 |

FOREIGN PATENT DOCUMENTS

| | | |
|---|---|---|
| CN | 1531023 | 9/2004 |
| JP | 11-298278 | 10/1999 |
| JP | 2001-257558 | 9/2001 |
| JP | 2003-046366 | 2/2003 |

\* cited by examiner

*Primary Examiner*—Mike Qi
(74) *Attorney, Agent, or Firm*—Harness, Dickey & Pierce, P.L.C.

(57) ABSTRACT

A method of manufacturing a crystal device includes applying substantially simultaneously a first light that is absorbed by a crystal plate and excites an energy level of a substance constituting the crystal plate from a ground state to a first excited state, and a second light that excites the energy level of the substance constituting the crystal plate from the first excited state to a second excited state to generate an ablation, thereby forming one or more grooves in a predetermined pattern on the crystal plate.

11 Claims, 8 Drawing Sheets

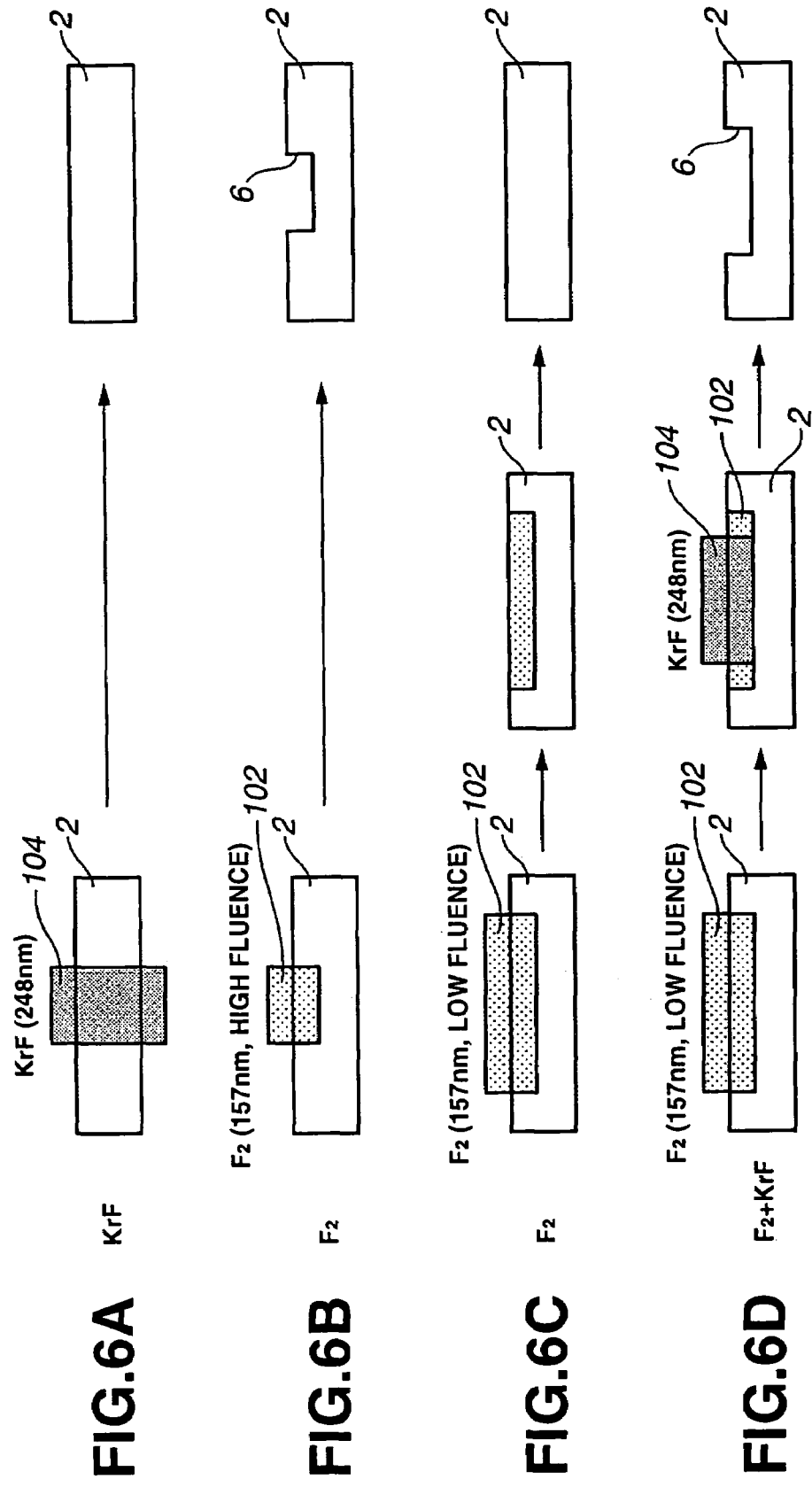

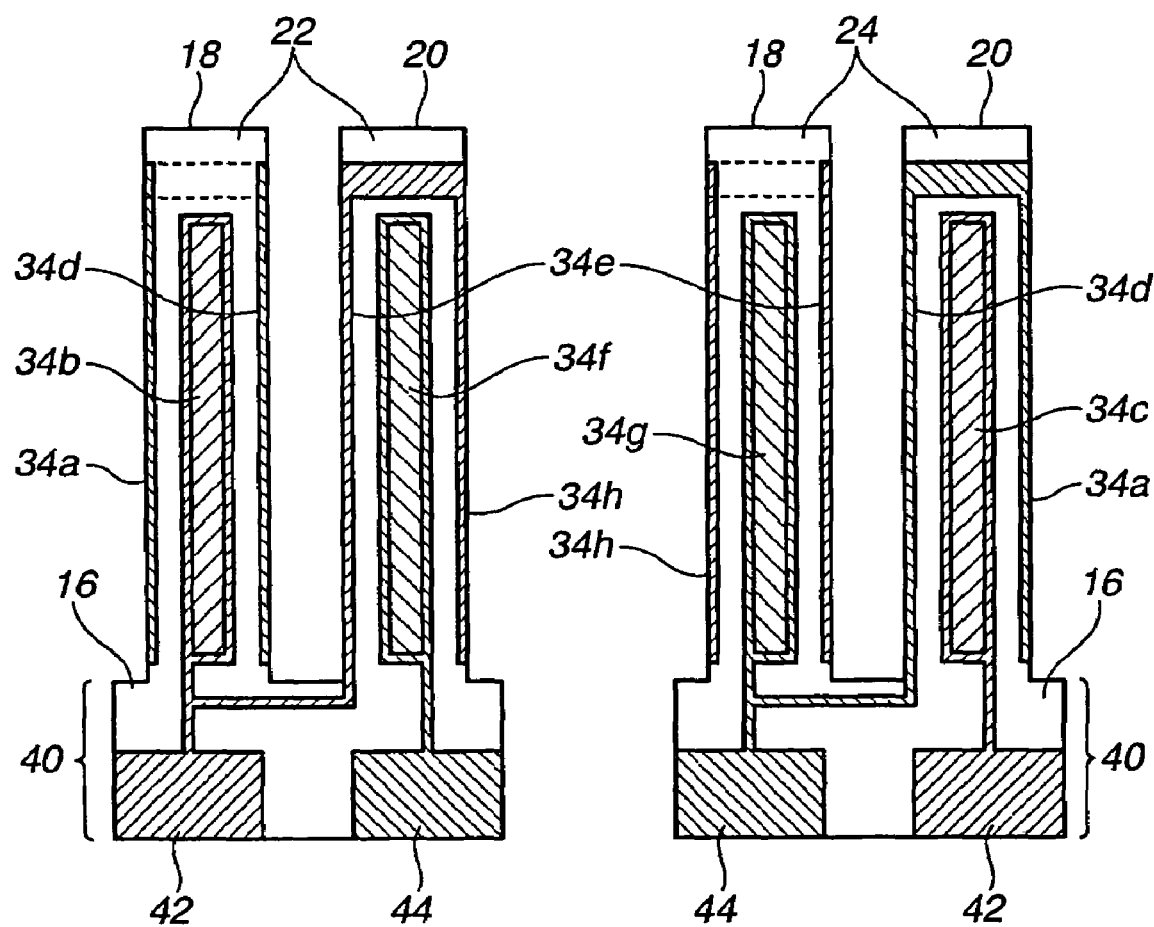

METHOD FOR MANUFACTURING A CRYSTAL DEVICE

CROSS-REFERENCES TO RELATED APPLICATIONS

The entire disclosure of Japanese Patent Application No. 2004-357508, filed on Dec. 10, 2004, is expressly incorporated by reference herein.

BACKGROUND

1. Technical Field

The present invention relates to a method for manufacturing a crystal device, and more specifically to a method for manufacturing a crystal device that can be made more easily.

2. Related Art

Conventionally, crystal oscillators are widely used as a source of clock signals in various electronic devices. The oscillation frequency of a crystal oscillator is determined by the resonance frequency of the crystal unit contained in the crystal oscillator. Examples of these crystal units include a convex or bevel crystal piece with a thickness increasing toward its center, prepared by the edges of an AT-cut crystal plate being processed to be curved surfaces. For example, JP-A-11-298278 discloses a convex crystal piece. These convex or bevel crystal units have a thick central portion to concentrate the vibration in the central portion of their crystal pieces, making efficient vibration with less energy possible. Also, in general, crystal units (i.e., crystal pieces) with the aforementioned shape are manufactured by polishing.

SUMMARY

In recent years, with the increased downsizing of various mobile devices, there has been an increasing demand to downsize crystal devices, which are components of these devices.

However, if these crystal devices are downsized, it will be difficult to control the shape of the crystal pieces contained in the crystal devices with a conventional polishing method, and it will also take a lot of processing time. Moreover, there is also an increasing demand to improve the workability of crystal units (i.e., the crystal pieces contained therein) other than those with the aforementioned structure.

Therefore, an advantage of some aspects of the invention is the provision of a method for manufacturing a crystal device that can be made more easily.

An aspect of the invention provides a method for manufacturing a crystal device including applying substantially simultaneously a first light that is absorbed by a crystal plate and excites an energy level of a substance constituting the crystal plate from a ground state to a first exited state, and a second light that excites the energy level of the substance constituting the crystal plate from the first excited state to a second excited state to generate an ablation, thereby forming one or more grooves in a predetermined pattern on the crystal plate.

According to the above aspect of the invention, the overlapped application of two predetermined lights (the first light and the second light) makes it possible to process a crystal plate of low workability easily with less damage in the region other than the processed region compared to the case here only one type of light is used for processing. Here, the first light is excitation light used to excite an electric energy level of a substance constituting a crystal plate to a predetermined energy level, and the second light is light used to process the crystal plate by enhancing the energy level of the crystal plate excited by the first light to a level whereby an ablation is generated.

Here, "substantially simultaneously" includes the case where a first light and a second light are applied with a predetermined time interval between them in addition to the case where a first light and a second light are applied simultaneously. The "predetermined time interval" refers to the short period of time required from the application of the first light to the enhancement of the energy level up to the first excited state after the absorption of the first light. The "substantially simultaneously" includes not only the case where the second light is applied after the application of the first light, but also the case where the first light is applied after the application of the second light.

The "ground state" refers to a steady low energy state before light application. The "second excited state" refers to an energy level at which crystal plate processing starts, and specifically refers to an energy level exceeding a vacuum level.

Furthermore, a crystal device refers to any device in general that includes crystal as a main component, and thus, is not limited to any specific device. However, examples of the crystal device include a crystal oscillator, crystal unit, and crystal sensor.

The order of application is not determined so long as there exists a period of time for the first light and the second light to be applied simultaneously. The second light may be overlapped onto the area where the first light is being applied. The first light may also be overlapped onto the area where the second light is being applied. The first and second lights may also be applied simultaneously.

For the first and second lights, it is preferable to use a laser, such as a pulse laser.

It is preferable that the area irradiated with the first light is larger than that irradiated with the second light, and that the second light overlaps the area where the first light is being applied. The area irradiated with the first light (or the irradiation diameter of the first light), which is excitation light, is made larger than the area irradiated with the second light (or the irradiation diameter of the second light), which is processing light, making it easy to adjust the positions of the first and second lights. Also, since the area irradiated with the first light is irradiated with a second light in an area smaller than the area irradiated with the first light, it is possible to move the second light with the first light fixed, making it possible to efficiently form a desired pattern even when processing a large area.

Preferably, an ablation is generated in the area where the first light and the second light are overlapped (i.e., that area is processed). When each of the first and second lights is applied independently, an ablation will not be generated, and even if an ablation is generated, it is not one sufficient to process (partially remove) a crystal plate, which facilitates easy position adjustment, etc.

The first excited state may be a state where the energy state is excited to a defective level or a conduction band.

It is preferable that the first light is light with a wavelength of no more than 160 nm. Light with this wavelength range exhibits effective absorption into crystal plates.

For a combination of the first light and the second light, more specifically, it is preferable that the first light is an $F_2$ laser with a wavelength of 157 nm, and the second light is an ArF excimer laser with a wavelength of 193 nm or a KrF excimer laser with a wavelength of 248 nm. Making the first and second lights have the aforementioned wavelengths makes it possible to process a crystal device (i.e., a crystal plate) efficiently.

It is also preferable that the first light and/or the second light form an image on the surface to be processed of the crystal plate via an optical imaging system. This makes it possible to form grooves in a desired pattern easily in a short time. Furthermore, when a desired pattern is formed via a mask, it may be formed with a collective irradiation, and it may also be formed upon dividing that pattern into partial regions and performing irradiation on each partial region.

The desired pattern may consist of, for example, one or more stripes. It may also consist of one or more rectangles. Making the groove pattern the aforementioned one makes it possible to obtain a crystal device with a favorable vibration property.

When a groove in the desired pattern is formed on two opposing surfaces of the crystal plate, it is preferable that the first light and the second light are overlapped substantially simultaneously on both surfaces of the crystal plate. Forming a desired pattern on two surfaces simultaneously makes it possible to reduce processing time.

Another aspect of the invention is a method for manufacturing a crystal device containing a tuning fork-shaped crystal piece having a plate-shaped base, and a plurality of arms extending from the base. The method includes applying substantially simultaneously a first light that is absorbed by a crystal plate and excites an energy level of a substance constituting the crystal plate from a ground state to a first exited state, and a second light that excites the energy level of the substance constituting the crystal plate from the first excited state to a second excited state to generate an ablation, thereby forming one or more grooves in a predetermined pattern on the crystal plate.

Preferably, the method according to the above aspect of the invention is a method for manufacturing a crystal device containing a tuning fork-shaped crystal piece having a plate-shaped base, and a plurality of arms extending from the base, the method including: forming at least one crystal piece in a crystal plate in such a manner that a portion of the crystal piece is connected to the crystal plate; applying substantially simultaneously to the arms a first light that is absorbed by the crystal plate and excites an energy level of a substance constituting the crystal plate from a ground state to a first exited state, and a second light that excites the energy level of the substance constituting the crystal plate from the first excited state to a second excited state to generate an ablation, thereby forming one or more grooves in a predetermined pattern on the arms; and forming a driving electrode for driving the crystal device on the crystal piece with the groove formed thereon.

DESCRIPTION OF DRAWINGS

FIGS. 6A to 6D are diagrams explaining the principle for a method for forming a groove 6 using a first light and a second light.

FIGS. 10A and 10B are diagrams explaining a method of manufacturing a tuning fork-shaped crystal unit.

DESCRIPTION OF EXEMPLARY EMBODIMENTS

Hereinafter, embodiments of the method for manufacturing a crystal unit according to the invention are explained with reference to the drawings. However, the invention is not limited to these embodiments.

First Embodiment

Figure 1:
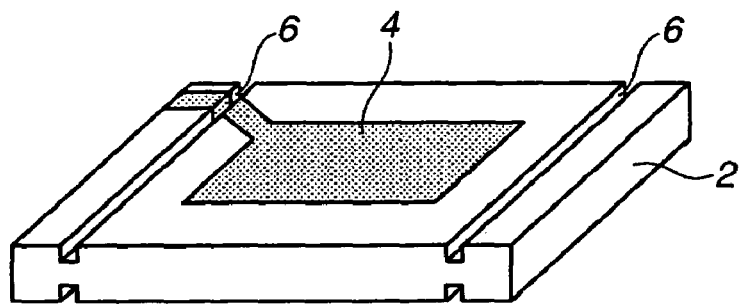
FIG. 1 shows an example of a crystal unit manufactured by the manufacturing method according to the present invention.

FIG. 1 shows an example of a crystal unit manufactured by the manufacturing method according to the present invention. As shown in FIG. 1, the crystal unit according to the present invention has an electrode 4 formed in a substantially central portion of each of two opposing surfaces of a crystal plate 2 (AT-cut crystal plate). The crystal plate 2 vibrates at a frequency determined by the thickness of the crystal plate 2 by the application of a voltage to the electrodes 4. Each electrode 4 is made from a conductive material such as gold or silver. Furthermore, each electrode 4 is connected to a lead electrode for external connection. The crystal plate 2 has a groove 6, which is substantially parallel to a longitudinal side of the electrode 4 (or the crystal plate 2), formed on two opposing side portions of the crystal plate 2 interposing the electrode 4. In this way, by forming the grooves 6 in the vicinity of the electrode 4, the vibration energy of the primary vibration mode (e.g., thickness shear vibration mode) spreads to the area around the electrode, making it possible to reduce vibration energy loss and also to suppress the secondary vibration mode, which causes peculiar phenomena such as a spurious vibration. Consequently, it becomes possible to confine the vibration energy of the primary vibration mode immediately below the electrodes 4, making it possible to obtain a crystal unit with favorable properties.

FIGS. 2A to 2D each show an example of a groove pattern for a crystal unit.

Figure 2A:
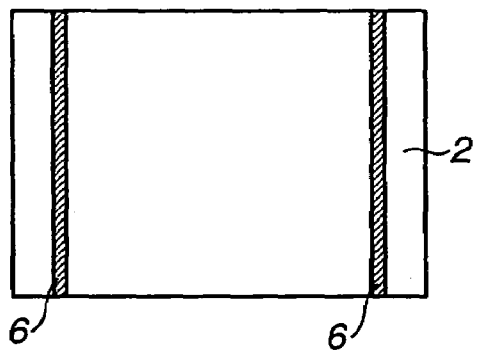
FIG. 2A to FIG. 2D show examples of crystal unit groove patterns.
Figure 2B:
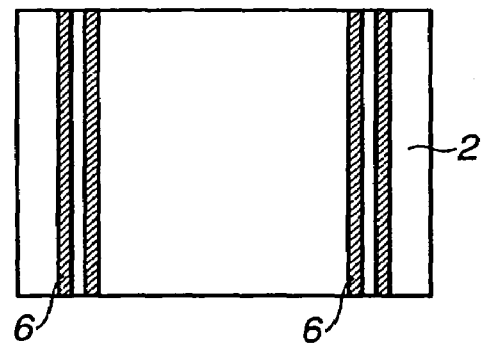
Figure 2C:
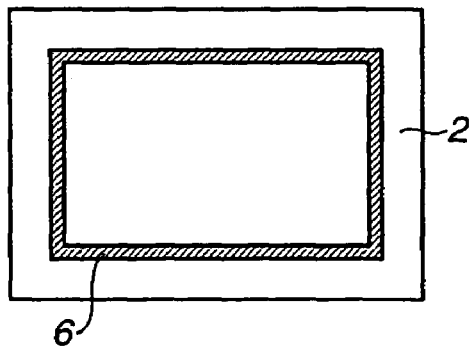
Figure 2D:
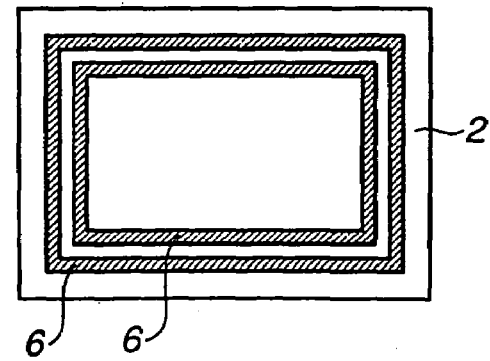

FIG. 2A corresponds to a top view of the crystal unit shown in FIG. 1. Incidentally, in FIG. 2A, the electrode 4 is omitted. A plurality of stripe grooves 6 may also be formed substantially symmetrically, interposing the electrode 4. FIG. 2B shows an example in which the grooves 6 are formed in twin lines on two opposing side portions of the crystal plate 2. The grooves 6 may also be formed in a rectangular shape. FIG. 2C and FIG. 2D respectively show an example in which one rectangular groove and a plurality of rectangular grooves (here, two rectangular grooves) is formed. Forming a plurality of grooves 6 as shown in the Figures makes it possible to further enhance the effect of confining the vibration energy of the primary vibration mode.

The pattern for the grooves 6 is not limited to the aforementioned examples, and may also be one in which intermissive concave portions (holes) are arranged in a plurality of lines.

Figure 3:
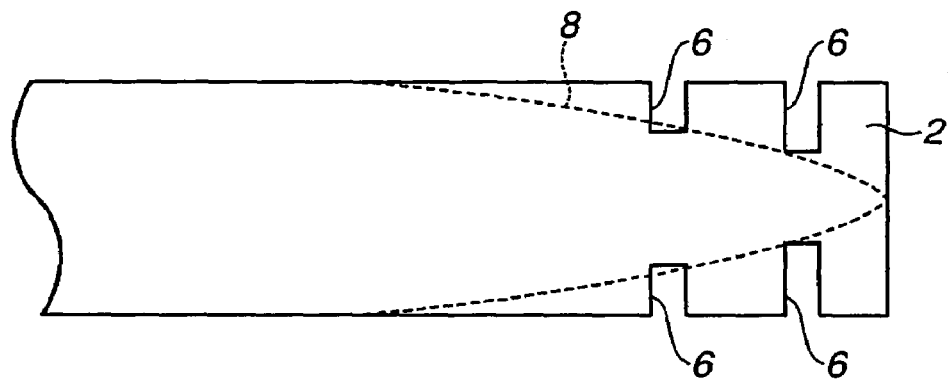
FIG. 3 is a partial cross-sectional view of a crystal unit having two grooves formed on two opposing surfaces.

FIG. 3 is a cross-sectional view of a crystal unit having two grooves formed on two opposing surfaces of a crystal plate.

As shown in FIG. 3, when a plurality of lines (here, two lines) of grooves 6 is formed, it is preferable that the depth of the grooves 6 gradually increases toward the sides of the crystal plate 2. This variation in the depth of the grooves 6 makes it possible to form a structure having properties close to those in what is called a convex structure or bevel structure. Accordingly, the vibration can be concentrated in the central portion of the crystal unit, making efficient vibration with less energy possible.

Next, the method for forming the aforementioned grooves 6 is explained below.

Figure 4:
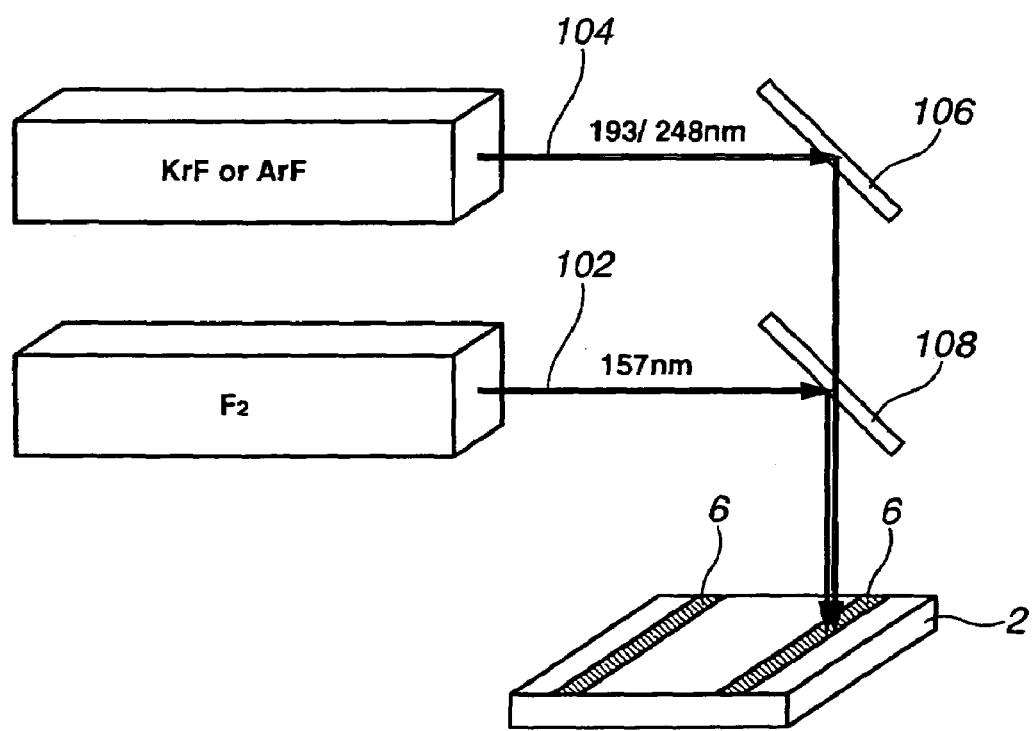
FIG. 4 shows an example of an apparatus used for the method of manufacturing a crystal unit according to the invention.

FIG. 4 shows an example of an apparatus used in the method for manufacturing a crystal unit according to the present invention.

In the invention, as shown in FIG. 4, groove processing is performed using two lights, i.e., a first light 102, and a second light 104, each having a predetermined wavelength. Here, the first light 102 and the second light 104 are configured so that they can respectively enter a surface to be processed of the crystal plate 2 substantially perpendicularly via beam splitters 106 and 108. However, the method of applying the first light 102 and the second light 104 is not limited to the above example.

The first light 102 is light that is absorbed by the crystal plate 2, and that can excite the electron energy level of a substance constituting the crystal plate 2 from a ground state to a first excited state. Here, the first excited state is an energy level that is higher than the ground state, and is before reaching, i.e., lower than, an energy level at which the crystal plate processing starts (second excited state). Specifically, it is a light with a wavelength that makes it possible for a transition (excitation) from a valence band to an energy level positioned between the valence band and a vacuum level. An example of such light is a light with a wavelength of no more than 160 nm. With such a wavelength, a favorable light absorption rate for a crystal plate can be obtained. More specifically, an $F_2$ laser with a wavelength of 157 nm, or a EUV (Extreme Ultra Violet) with a wavelength of 10 to 13 nm can be used.

The second light 104 is light that can excite the electron energy level of the substance constituting the crystal plate 2 from the first exited state to the second exited state. Specifically, it is a light with a wavelength causing the crystal plate 2 transited (excited) by the first light 102 to exhibit an absorption of the vacuum level. The kind of light is not specifically restricted, but an ArF excimer laser with a wavelength of 193 nm or a KrF excimer laser with a wavelength of 248 nm may be used.

Figure 5:
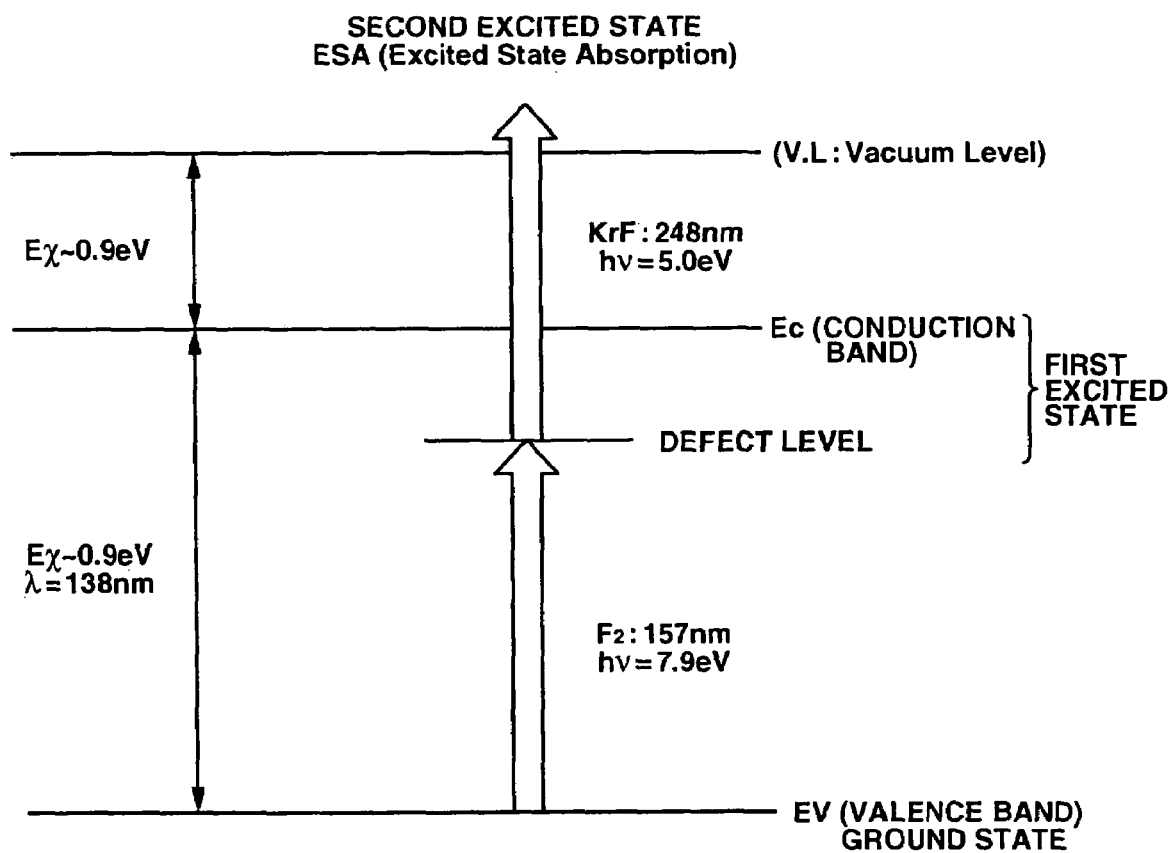
FIG. 5 shows the energy level of a crystal plate when a first light and a second light are combined.

FIG. 5 shows the energy level of a crystal plate when the first light and the second light are combined. As shown in FIG. 5, an $F_2$ laser (wavelength: 157 nm; and energy: hu=7.9 eV) is applied as the first light 102 to the crystal plate 2, the electrons in crystal constituting the crystal plate are excited from the valence band (Ev) to a defect level. Applying a KrF excimer laser (wavelength: 248 nm; and energy: hu=5.0 eV) as the second light 104 in combination with the first light 102, the electrons will be further excited from the defect level to an excited level (an energy level exceeding the vacuum level). This causes an ablation, thereby processing the crystal plate 2. Here, as an example of the first light 102, a light that excites the energy level of electrons from the valence band to the defect level is explained. However, the first light 102 is not specifically limited as far as being one that can excite the energy of electrons to an energy level between the valence band and the vacuum level, and may be, for example, one that excites them to the conduction band (Ec).

A further description of the principle for a method of forming a groove 6 using the first light 102 and the second light 104 is given below. FIG. 6 is a diagram explaining the principle for a method of forming a groove 6 using the first and second lights.

As shown in FIG. 6A, even if, for example, a KrF excimer laser with a wavelength of 248 nm is applied as the second light 104 to the crystal plate 2, which is an object to be processed, it is not enough to sufficiently raise the energy level of the object to be processed because of the low absorption rate for the object to be processed.

Meanwhile, as shown in FIG. 6B, when an $F_2$ laser with a wavelength of 157 nm, which exhibits an absorption into the crystal plate 2, is applied as the first light 102 to the crystal plate 2, if the fluence (energy density) is high, an ablation is generated, thereby the crystal plate 2 being processed.

However, in some cases, it is desirable to widen the irradiated area to enhance the processing efficiency. In those cases, the fluence becomes lower if the same output apparatus is used. When the fluence is lowered by widening the irradiated area as shown in FIG. 6C, i.e., when it becomes, for example, no more than ¹⁄₁₀₀ of the fluence that can process the crystal plate 2, an ablation will not be generated because of an insufficiency in energy. Accordingly, with that fluence, when irradiation light is off, the electrons return to the previous energy level, having no influence on the outer shape of the crystal plate 2.

Meanwhile, as shown in FIG. 6D, when a combination of the first light 102 (an $F_2$ laser with a wavelength of 157 nm) and the second light 104 (a KrF excimer laser with a wavelength of 248 nm) is applied to the crystal plate 2, the aforementioned excitation of the energy level occurs, thereby only the area where the first and second lights 102 and 104 are overlapped being processed. In this way, combining specific lights that do not individually generate ablations makes it possible to generate an ablation.

Figure 7A:
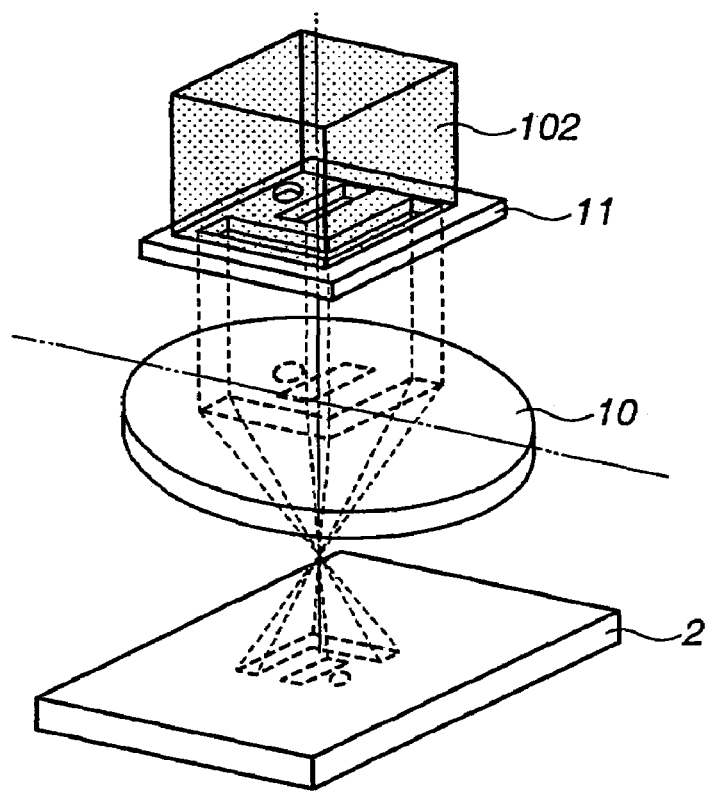
FIGS. 7A and 7B are diagrams explaining an example of a method for forming a groove 6.
Figure 7B:
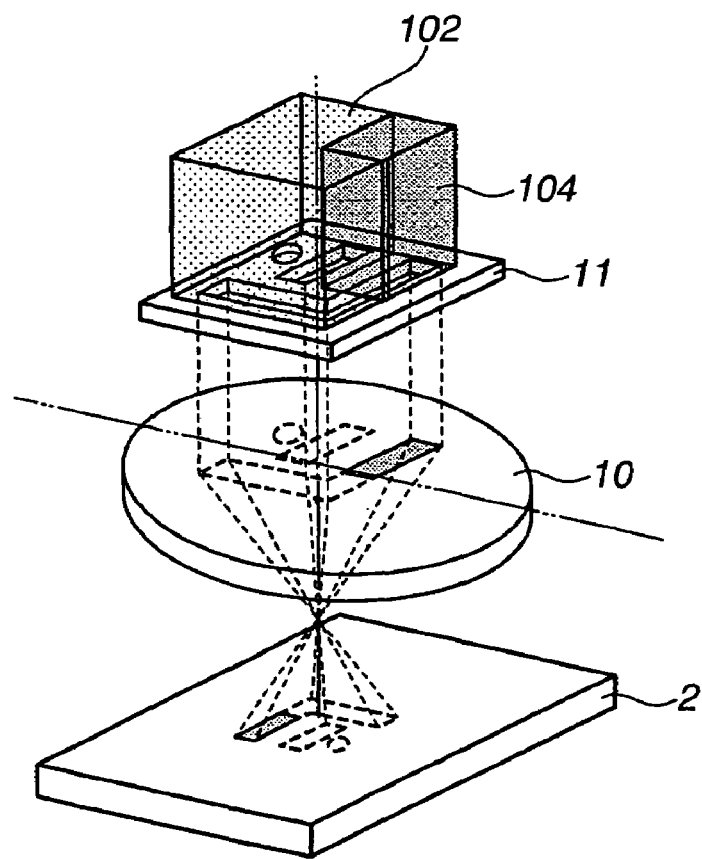

Next, a more detailed description of a method for forming a groove 6 is given below with reference to FIGS. 7A and 7B. FIGS. 7A and 7B are diagrams explaining an example of a method for forming a groove 6. Here, an example using an optical imaging system is described.

First, as shown in FIG. 7A, the first light 102 (an $F_2$ laser with a wavelength of 157 nm) is applied to the crystal plate 2 (AT-cut crystal plate) via a mask 11 having a predetermined groove pattern therein and a condenser lens 10. At this time, the first light 102 is applied with its laser beam width widened so as to include the entire region where the groove pattern is formed.

Next, as shown in FIG. 7B, the second light 104 (a KrF excimer laser with a wavelength of 248 nm) is applied so as to overlap the area irradiated with the first light 102. Specifically, the second light 104 has an irradiated area that can be included in the area irradiated with the first light 102, and a groove pattern is formed by sequentially moving the area irradiated with the second light 104 with the first light 102 fixed. In this way, adjusting the size of the second light 104 can make it easy to adjust the positions of the first light 102 and the second light 104, and also, only moving the second light 104 makes it possible to form a desired pattern, facilitating easy operation. Accordingly, even when processing a large area, it is possible to form a groove pattern easily.

A reduced image of a groove pattern formed in the mask is formed on the crystal plate 2 through the above process.

Here, the depth of the grooves 6 can be adjusted by arbitrarily changing the fluence (energy density), application time, oscillation time, etc., of the first light 102 and/or the second light 104.

A crystal unit can be obtained by forming, using a conventionally-known method, electrode(s) 4 as shown in FIG. 1 on the crystal plate 2 having a desired groove pattern formed thereon by the above process.

According to this embodiment, a crystal unit is manufactured by overlapping the first light 102 and the second light 104, making it possible to reduce damage in the region other than the region to be processed of a crystal plate of low workability, compared to the case where processing is performed by applying one type of light, and also making it possible to process the crystal plate easily. Furthermore, the use of an optical imaging system makes it possible to collectively form grooves in a desired pattern on the crystal plate 2. Still further, the area irradiated with the second light 104 is made smaller than the area irradiated with the first light 102, facilitating easy adjustment of the positions of the first light 102 and the second light 104. Also, the area irradiated with the first light 102 is irradiated with the second light 104 in an area smaller than that irradiated with the first light 102, making it possible to move the second light with the first light fixed, and also to efficiently form a desired pattern even when processing a large area.

In this embodiment, the area irradiated with the second light 104 is smaller than that irradiated with the first light 102. However, the area irradiated with the second light 104 may be larger than or the same as that irradiated with the first light 102.

In this embodiment, a laser with a single wavelength is used for each of the first light 102 and the second light 104. However, a laser with a combination of different wavelengths may be used.

Second Embodiment

In this embodiment, a method for manufacturing a crystal unit having another shape is described. Specifically, a method for manufacturing a tuning fork-shaped crystal unit is described.

FIGS. 8A to 10B are diagrams explaining a method for manufacturing a tuning fork-shaped crystal unit.

Figure 8A:
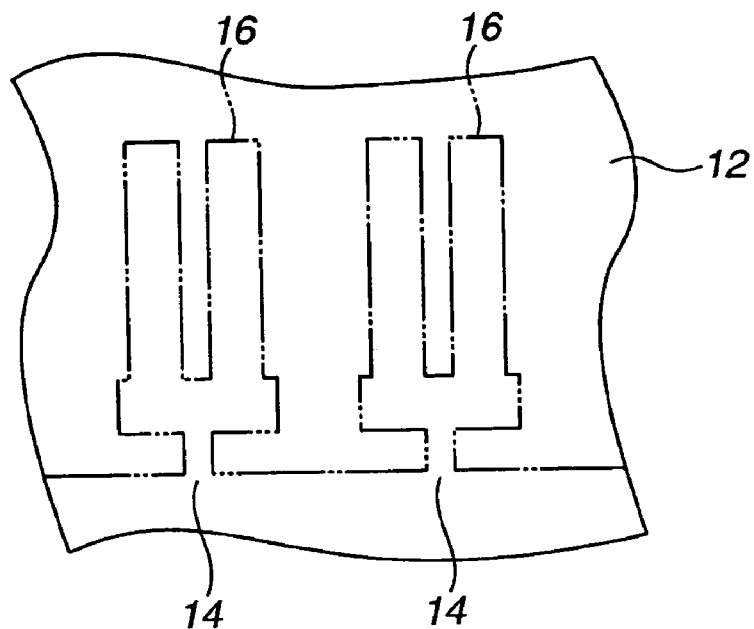
FIGS. 8A and 8B are diagrams explaining a method for manufacturing a tuning fork-shaped crystal unit.
Figure 8B:
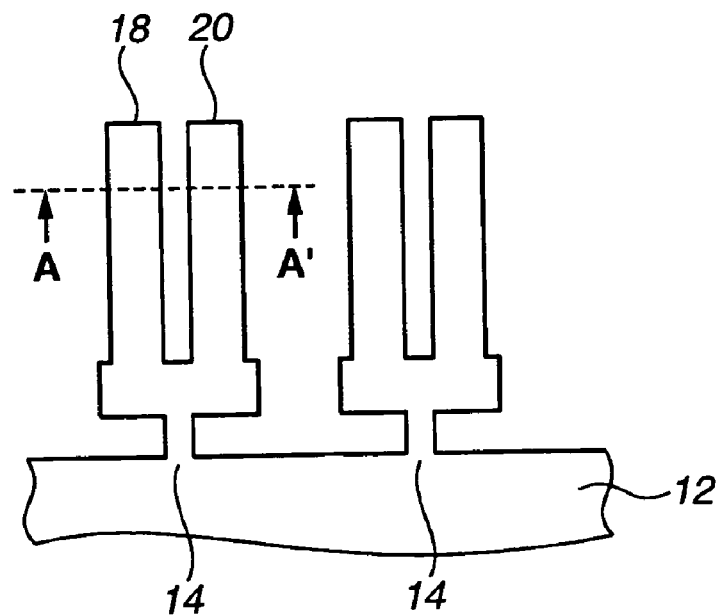

First, a crystal plate 12 is processed by applying a first light 102 and a second light 104 using a laser processing apparatus of the same type as shown in FIG. 4 along the chain double-dashed line shown in FIG. 8A into a shape with a plurality of tuning fork-shaped structures in which a plurality of crystal pieces 16, which are to form crystal units, are connected to the crystal plate 12 with connecting parts 14 (See FIG. 8B). At this time, the processing conditions, such as the application strength and the number of shots (the number of applications per unit time), of the first light 102 and the second light 104 are arbitrarily adjusted so that the lights can penetrate the crystal plate 12.

Figure 9A:
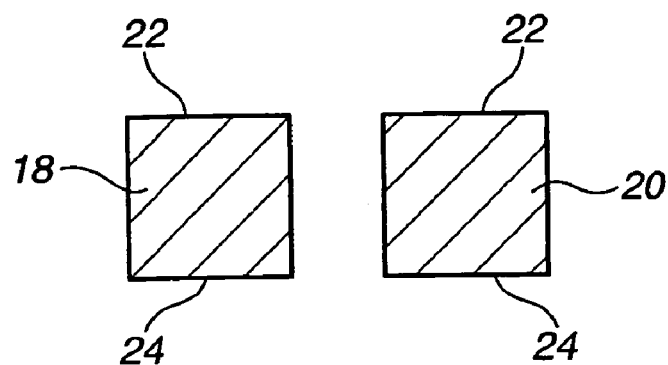
FIGS. 9A to 9D are diagrams explaining a method of manufacturing a tuning fork-shaped crystal unit.
Figure 9B:
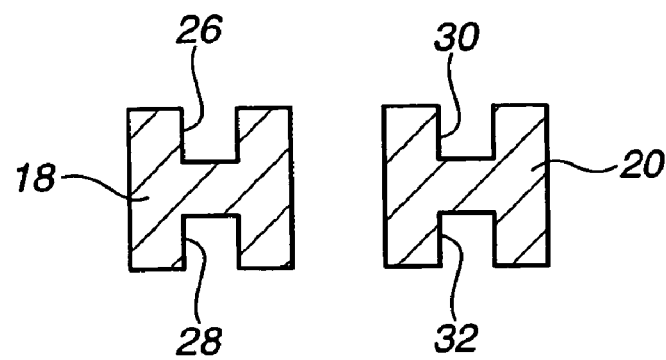

Hereinafter, the manufacturing process is explained with reference to FIG. 9A, which is a cross-sectional view taken along the line A-A' shown FIG. 8B. As shown in FIG. 9B, the first light 102 and the second light 104 are applied using the laser processing apparatus shown in FIG. 4 to form grooves 26, 28, 30 and 32 on arms 18 and 20 of a crystal piece 16. The grooves may be formed by separately processing each of two opposing surfaces of the crystal plate 12, or simultaneously formed on the two opposing surfaces.

Figure 9C:
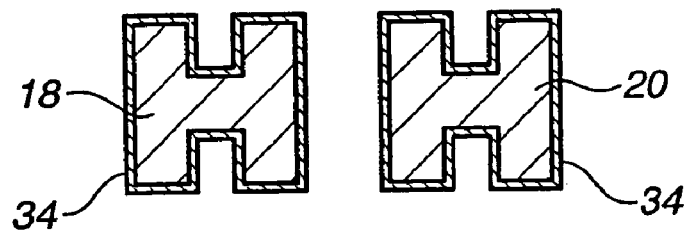
Figure 9D:
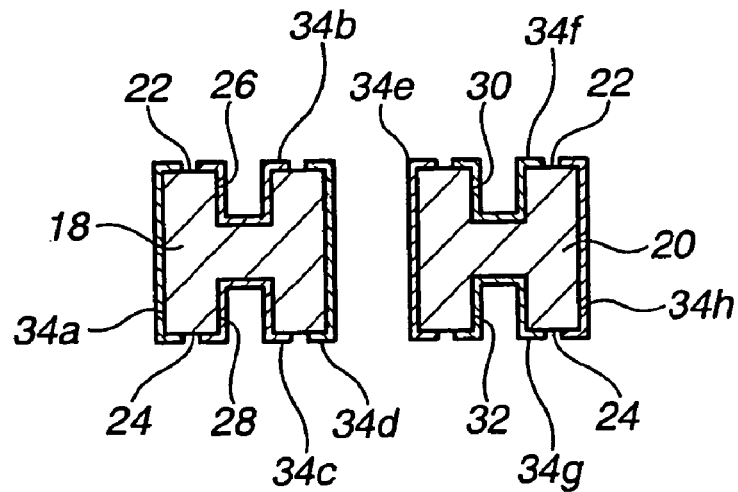

Next, as shown in FIG. 9C, a film (conducting layer) 34 consisting of a conductive metal such as Au or Ag is formed by sputtering or similar. Here, it is preferable that the conducting film 34 is formed on the crystal piece 16 via an adhesive layer (e.g., a Cr film) with high adhesiveness to Au, Ag, and crystal. Next, as shown in FIG. 9D, the conducting film 34 is patterned into a desired shape using a laser such as an $F_2$ excimer laser. Subsequently, a crystal unit can be obtained by cutting each crystal piece 16 off from each connecting part 14 that connects the crystal piece 16 to the crystal plate 12.

The structure of the crystal unit is further explained below. FIGS. 10A and 10B each show a side view of the crystal unit. As shown in FIGS. 10A and 10B, the crystal unit according to this embodiment has a plate-shaped base 40, and two arms 18 and 20 extending substantially in parallel with each other in an identical direction from the base 40. The arms 18 and 20 have surfaces 22 and 24 with the grooves 26, 28, 30, and 32 extending along a longitudinal direction formed thereon. A first driving electrode and a second driving electrode for supplying a voltage to drive a piezoelectric oscillator are provided on the crystal piece 16. The first and second driving electrodes each have similar configurations on opposing surfaces of the crystal unit. Specifically, a pair of electrode parts 34*b* and 34*c* formed on the front and back side surfaces of the arm 18, and a pair of electrode parts 34*e* and 34*h* formed on the left and right side surfaces of the arm 20 are electrically connected to each other, and they are further electrically connected to a terminal portion 42 of the base 40 to form the first driving electrode. Similarly, a pair of electrode parts 34*f* and 34*g* formed on the front and back side surfaces of the arm 20, and a pair of electrode parts 34*a* and 34*d* formed on the left and right side surfaces of the arm 18 are electrically connected to each other, and they are further connected to a terminal portion 44 of the base 40 to form the second driving electrode.

According to this embodiment, compared to the case where only one type of light is used for processing, overlapped application of the first light 102 and the second light 104 makes it possible to process a tuning fork-shaped crystal unit having the aforementioned three dimensional complex shape easily while reducing loss on the region other than the region to be processed of a crystal plate of low workability.

What is claimed is:

1. A method of manufacturing a crystal device comprising applying substantially simultaneously a first light that is absorbed by a crystal plate and excites an energy level of a substance constituting the crystal plate from a ground state to a first excited state, and a second light that excites the energy level of the substance constituting the crystal plate from the first excited state to a second excited state to generate an ablation, thereby forming one or more grooves in a predetermined pattern on the crystal plate.

2. The method of manufacturing a crystal device according to claim 1,
wherein an area irradiated with the first light is larger than that irradiated with the second light; and
wherein the second light is overlapped within the area irradiated the first light.

3. The method of manufacturing a crystal device according to claim 2, wherein an ablation is generated within the area where the first light and the second light are overlapped.

4. The method of manufacturing a crystal device according to claim 1, wherein the first excited state is a state in which the energy level is excited to a defect level or a conductive band.

5. The method of manufacturing a crystal device according to claim 1, wherein the first light is light having a wavelength of no more than 160 nm.

6. The method of manufacturing a crystal device according to claim 1, wherein the first light is an $F_2$ laser having a wavelength of 157 nm, and the second light is an ArF excimer laser having a wavelength of 193 nm or a KrF excimer laser having a wavelength of 248 nm.

7. The method of manufacturing a crystal device according to claim 1, wherein the first light and/or the second light form an image on a surface to be processed of the crystal plate via an optical imaging system.

8. The method of manufacturing a crystal device according to claim 1, wherein the groove pattern consists of one or more stripes.

9. The method of manufacturing a crystal device according to claim 1, wherein the groove pattern consists of one or more rectangles.

10. The method of manufacturing a crystal device according to claim 1, wherein upon the grooves in the predetermined pattern being formed on two opposing surfaces of the crystal plate, the first light and the second light are overlapped substantially simultaneously on the two opposing surfaces of the crystal plate.

11. The method of manufacturing a crystal device according to claim 1, wherein the first light and/or the second light are applied to form the predetermined pattern collectively, or separately to each partial region into which the pattern is divided.

* * * * *